United States Patent
Xu et al.

(10) Patent No.: US 11,646,720 B2
(45) Date of Patent: May 9, 2023

(54) ACTIVE FILTER FOR ELECTROMAGNETIC INTERFERENCE (EMI) REDUCTION USING A SINGLE CONNECTION POINT AND A NEGATIVE IMPEDANCE CONVERTER WITH CROSS-COUPLED TRANSISTORS

(71) Applicant: Hong Kong Applied Science and Technology Research Institute Company Limited, Hong Kong (HK)

(72) Inventors: Danting Xu, Hong Kong (HK); Kun Wu, Shenzhen (CN); Ziyang Gao, Hong Kong (HK)

(73) Assignee: Hong Kong Applied Science and Technology Research Institute Company Limited

( * ) Notice: Subject to any disclaimer, the term of this patent is extended or adjusted under 35 U.S.C. 154(b) by 0 days.

(21) Appl. No.: 17/668,225

(22) Filed: Feb. 9, 2022

(65) Prior Publication Data
US 2022/0239282 A1    Jul. 28, 2022

Related U.S. Application Data

(63) Continuation-in-part of application No. 17/091,089, filed on Nov. 6, 2020, now Pat. No. 11,303,264.

(51) Int. Cl.
*H03H 11/04* (2006.01)
*H03H 7/01* (2006.01)
(Continued)

(52) U.S. Cl.
CPC ............ *H03H 11/04* (2013.01); *H02M 1/123* (2021.05); *H02M 1/44* (2013.01); *H03H 7/0115* (2013.01);
(Continued)

(58) Field of Classification Search
CPC .......... H02M 1/44; H02M 1/15; H02M 1/126; H02M 1/12; H02M 1/14; H02M 1/4225;
(Continued)

(56) References Cited

U.S. PATENT DOCUMENTS

| | | | |
|---|---|---|---|
| 5,734,294 A | 3/1998 | Bezzam et al. | |
| 8,823,448 B1 * | 9/2014 | Shen | H04B 15/00 327/552 |

(Continued)

FOREIGN PATENT DOCUMENTS

CN          101223689 A       7/2008

OTHER PUBLICATIONS

ISR and Written Opinion, PCT/CN2022/076523, dated Nov. 10, 2022.

(Continued)

*Primary Examiner* — John W Poos
(74) *Attorney, Agent, or Firm* — g Patent LLC; Stuart T. Auvinen

(57) ABSTRACT

An active filter reduces Electro-Magnetic Interference (EMI) created by current flowing through a power line. The active filter connects to the power line at a single node through a connection capacitor. A sense current flows through the connection capacitor when the power line current changes. This sense current is applied to a gain control circuit having cross-coupled PNP transistors that drive currents to both terminals of a variable capacitor. The variable capacitor converts these currents to a voltage that is injected back into the power line through the connection capacitor as an injected compensation voltage that compensates for the sensed current.

20 Claims, 12 Drawing Sheets

(51) Int. Cl.
*H03H 11/44* (2006.01)
*H03H 11/24* (2006.01)
*H02M 1/44* (2007.01)
*H02M 1/12* (2006.01)

(52) U.S. Cl.
CPC .......... *H03H 11/245* (2013.01); *H03H 11/44* (2013.01); *H03H 2011/0483* (2013.01)

(58) Field of Classification Search
CPC ...... H02M 3/158; H02M 1/08; H02M 1/4208; H02M 1/42; H02M 1/32; H02M 3/07; H02M 3/335; H02M 3/1584; H02M 3/156; H02M 1/36; H02M 1/143; H03F 3/45475; H03F 1/34; H03F 1/26; H03F 1/52; H03F 1/30; H03F 1/565; H03H 1/0007; H03H 11/04
See application file for complete search history.

(56) References Cited

U.S. PATENT DOCUMENTS

| | | | |
|---|---|---|---|
| 10,476,464 B2 | 11/2019 | Rambaud et al. | |
| 11,437,983 B2 * | 9/2022 | Chan | H03F 3/04 |
| 2014/0063872 A1 | 3/2014 | Hamza et al. | |
| 2014/0292401 A1 * | 10/2014 | Shen | H03H 11/126 327/552 |
| 2018/0294714 A1 * | 10/2018 | Chu | H02M 1/15 |
| 2019/0029148 A1 | 1/2019 | Han et al. | |

OTHER PUBLICATIONS

Dongli Shin et al., "Quantified Design Guidelines of a Compact Transformerless Active EMI filter for Performance, Stability, and High Voltage Immunity", IEEE Trans Power Elect. vol. 33, No. 8, Aug. 2018, pp. 6723-6737.

* cited by examiner

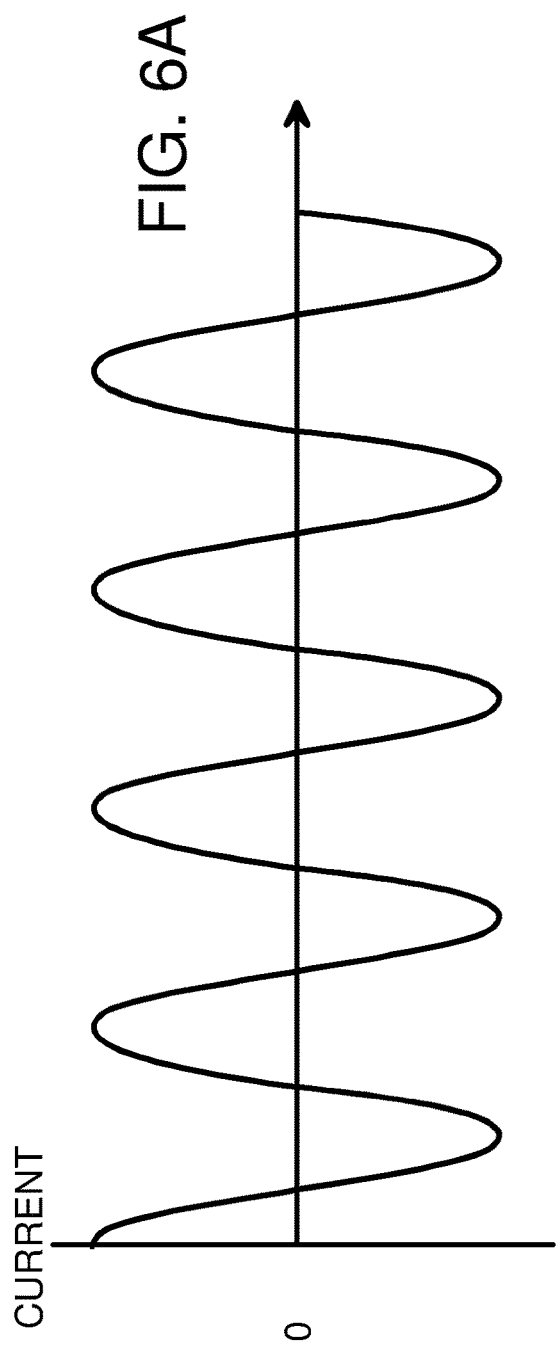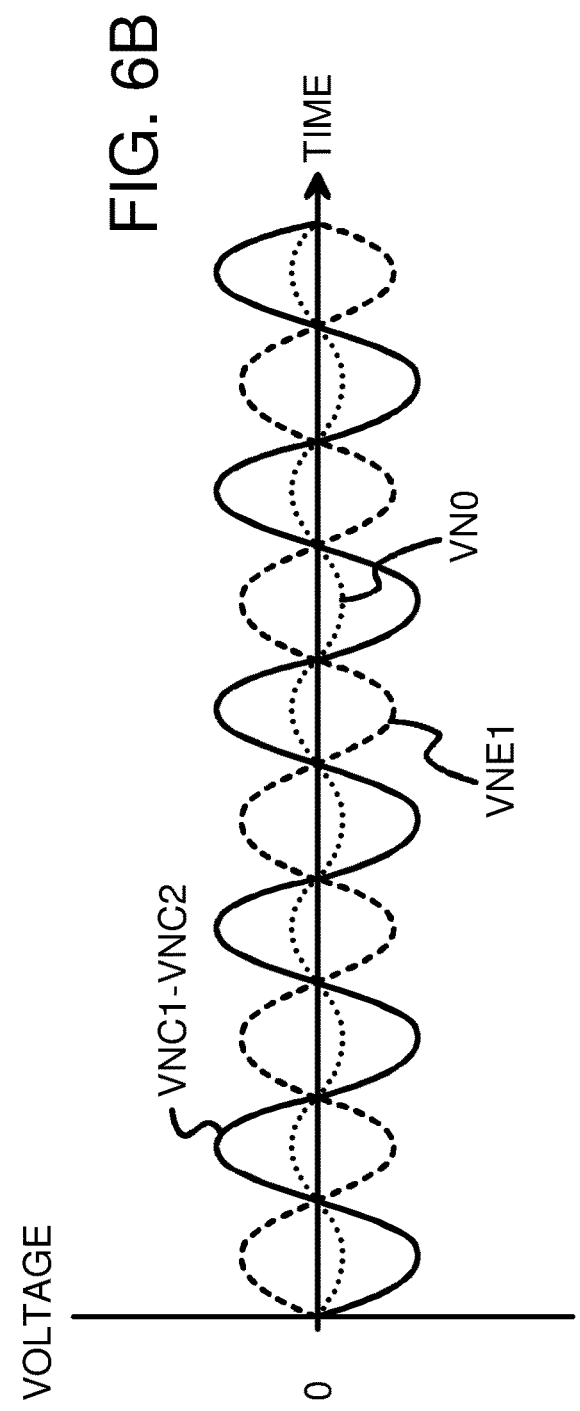

ACTIVE FILTER FOR ELECTROMAGNETIC INTERFERENCE (EMI) REDUCTION USING A SINGLE CONNECTION POINT AND A NEGATIVE IMPEDANCE CONVERTER WITH CROSS-COUPLED TRANSISTORS

RELATED APPLICATION

This application is a Continuation-In-Part (CIP) of "Active Filter for Electromagnetic Interference (EMI) Reduction Using a Single Connection Point and a Negative Impedance Converter", U.S. Ser. No. 17/091,089, filed Nov. 6, 2020.

FIELD OF THE INVENTION

This invention relates to active filter circuits, and more particularly to single-point sense-and-inject active filters for Electro-Magnetic Interference (EMI) reduction.

BACKGROUND OF THE INVENTION

Filters are used for a variety of circuits. For example, a Switch-Mode Power Supply (SMPS) has power transistors that are rapidly turned on and off, such as at a rate of a few hundred of kHz. These SMPS can deliver energy to home appliances, computers, medical devices, telecom systems, automotive systems, and many other applications.

However, the rapid switching of the transistors in the SMPS can create Electro-Magnetic Interference (EMI) in other devices. Standards have been set to limit such EMI, such as the EN55022 standard that many SMPS must pass.

Passive EMI filters are traditionally added to power supplies and other EMI-generating devices. These passive EMI filters tend to be large and bulky since they rely upon inductors and capacitors. Although passive EMI filters are simple and effective at reducing EMI, they can be bulky, heavy, and have a power loss.

FIG. 1 shows a prior-art active EMI filter with separate sensor and injection points. Active EMI filters can use an op amp with a more complex circuit to reduce the size and bulk of the EMI filter. A positive input POS_IN is filtered to generate a positive output POS_OUT that has reduced EMI. Capacitor 108 between POS_OUT and ground GND_OUT helps to maintain a constant supply voltage on POS_OUT when variations occur in the load current.

The power current from POS_IN is sensed by sense inductor 102. Current changes such as an increase in the power current flowing through the primary windings of sense inductor 102 induce a current in the same direction in the secondary windings of sense inductor 102. Sense inductor 102 increases the voltage on the inverting input of op amp 110, which generates an opposite voltage at the bottom terminal of capacitor 104. The charge on capacitor 104 causes a positive voltage at the top terminal of capacitor 104. Since the current is sinking into the output of the operational amplifier through capacitor 104, the voltage on injector inductor 106 will inject the compensated voltage through the secondary windings of injector inductor 106, cancelling the noise voltage in the main. Thus the noise voltage is reduced by the active filter.

The active filter has separate sense and injection points. Sense inductor 102 senses the current changes in the power supply, while injector inductor 106 injects a back-current into the power line to compensate for the sensed voltage. While the active filter is smaller than a passive filter, having separate sense and injection points can still required two bulky inductors. Some active filters replace one of sense inductor 102, injector inductor 106 with a capacitor, but the remaining inductor is still bulky and therefore undesirable. Bulky inductors not only occupy much space and weight, but also have bandwidth limitations due to parasitic, non-ideal coupling, and self-resonance of inductors.

FIG. 2 highlights an active filter with a single point of attachment. The parent application described an active filter with a single point of attachment. Node NO is a single node on line 10, which can be a power-supply line in a SMPS or a line that is being filtered to reduce noise such as produced by EMI from line 10. Connection capacitor 20 connects to node NO on line 10. The other terminal of connection capacitor 20 connects to negative capacitance circuit 120.

Connection capacitor 20 acts as both the sensor and the injector of the active filter. Changes in the current flowing along line 10 cause a sensed current $I_{SENSE}$ to flow through connection capacitor 20 from line 10 to negative capacitance circuit 120. In response, negative capacitance circuit 120 generates a voltage change $V_{INJECT}$ that is applied to connection capacitor 20 and injected back into line 10. $V_{INJECT}$ compensates for $I_{SENSE}$ to reduce the current fluctuation in line 10, and thus reduce the EMI generated by line 10.

Negative capacitance circuit 120 has an impedance in the form of $Z=V/I=-1/(sC)$, where V and I are the AC voltage drop and current on negative capacitance circuit 120, s is a scale constant and C is an effective capacitance. In the frequency domain, for a normal positive capacitance, as a current I flows through a capacitor, the voltage drop across the capacitor will be $(1/sC) \times I$, where the coefficient $(1/sC)$ is the impedance of the capacitor, and in time domain the current will lead the voltage by 90 degrees. With a negative capacitance, the voltage drop across the capacitance will be $(-1/sC) \times I$, where the coefficient $(-1/sC)$ is the impedance of the negative capacitance circuit, and in time domain the current will lag the voltage by 90 degrees. In this way, the voltage drops across a positive capacitance and a negative capacitance will be anti-phase (180-degree difference).

When the sensed current $I_{SENSE}$ flows in the direction as shown in FIG. 2 through connection capacitor 20 and negative capacitance circuit 120 to the ground, negative capacitance circuit 120 acts as a negative capacitance, so negative capacitance circuit 120 produces a negative voltage drop between its two terminals rather than a positive voltage drop. Negative capacitance circuit 120 acts as a current-controlled-voltage source with an input impedance of $Z=-1/(sC)$.

Since the bottom terminal of negative capacitance circuit 120 is ground, the voltage at the top terminal of negative capacitance circuit 120 is negative. The negative voltage generated by negative capacitance circuit 120 pulls the voltage of the bottom plate of connection capacitor 20 lower in voltage. Since connection capacitor 20 is a regular capacitance, the charge in it generates a voltage difference between $V_{inject}+$ and $V_{inject}-$. $V_{inject}+$ is pulled low because $V_{inject}-$ is pulled lower by negative capacitance circuit 120, helping to reduce noise voltage $V_{inject}+$ in line 10 and thus reduce EMI.

FIG. 3 shows a high-level block diagram of the active filter of the parent application. Connection capacitor 20 connects to node NO of line 10. Changes in the current flowing through line 10 are sensed by connection capacitor 20 and applied to an input of gain control circuit 112. The output of gain control circuit is in phase with the input, and is applied to filter capacitor 156, which connects gain control circuit 112 to the input of power amplifier 114. Power amplifier 114 provides a higher current to drive transfer capacitor 30.

Gain Control circuit 112 acts as a resistive voltage divider circuit. Capacitors 20, 30 act as a capacitive voltage divider. The voltage at node N1 between capacitors 20, 30 is driven below ground by higher current in line 10, as negative capacitance circuit 120 did in FIG. 2. The voltage of node N1 going below ground is coupled across connection capacitor 20 to inject a compensation voltage back into line 10 to compensate for the higher current in line 10.

While the active filter of the parent application is useful and effective, gain control circuit 112 may require an op amp Integrated Circuit (IC). Performance of the active filter may be limited by the op amp IC. Also, power amplifier 114 may require a large current. Thus a different circuit for the active filter is desired for added design flexibility and potentially reduced cost.

What is desired is an active EMI filter that has no inductors. An active EMI filter having a single point of connection to the power line is desired. An active EMI filter that has a single-point connection through a capacitor is desired. It is desired that the single-point connection capacitor both senses current changes and injects compensation back into the power line. An active filter that uses a negative capacitance concept is desired to sense and drive feedback the single-point capacitor. An active filter with variable components is desired for gain compensation for temperature and frequency bands is also desired.

BRIEF DESCRIPTION OF THE DRAWINGS

FIGS. 6A-6B are graphs of operation of the active filter.

DETAILED DESCRIPTION

The present invention relates to an improvement in active filters. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
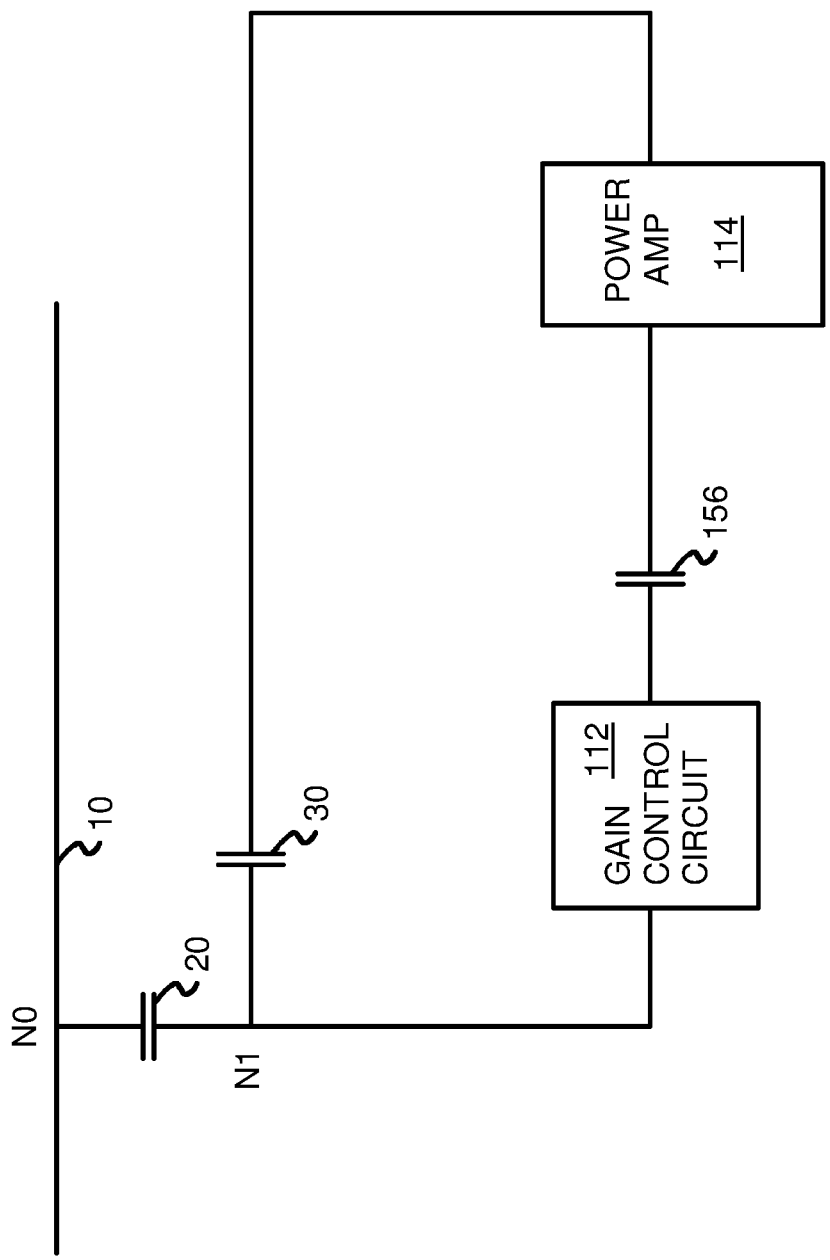
FIG. 3 shows a high-level block diagram of the active filter of the parent application.
Figure 4:
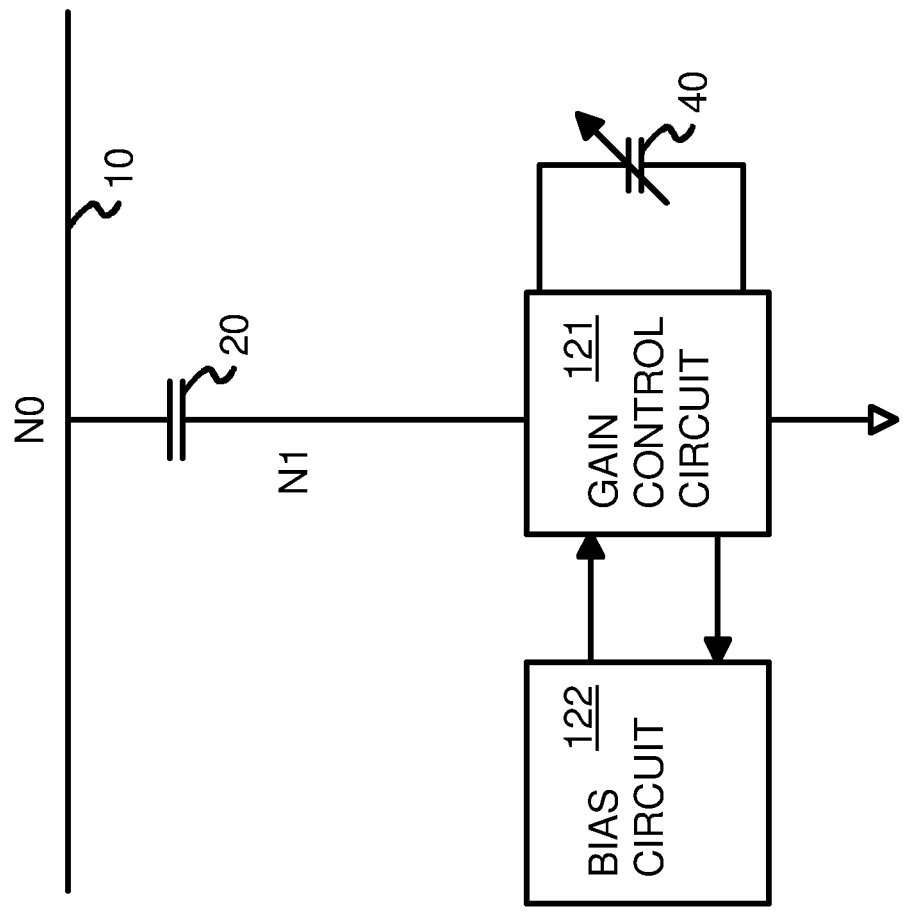
FIG. 4 shows a high-level block diagram of the improved active filter.

FIG. 4 shows a high-level block diagram of the improved active filter. Power amplifier 114 from the parent application's active filter of FIG. 3 has been deleted. Also transfer capacitor 30 and filter capacitor 156 of FIG. 3 have been replaced by a single capacitor, variable capacitor 40. A different circuit is used for gain control circuit 121 than for gain control circuit 112.

Connection capacitor 20 connects to node N0 of line 10. Changes in the current flowing through line 10 are sensed by connection capacitor 20 as a sense current passing through connection capacitor 20 that is applied to an input of gain control circuit 121. Gain control circuit 121 is controlled by this sense current.

Gain control circuit 121 drives an internal current onto variable capacitor 40 in response to the sense current. Variable capacitor 40 converts the internal current to an internal voltage. Gain control circuit 121 responds to the internal voltage on variable capacitor 40 and injects a compensation voltage back from gain control circuit 121 through connection capacitor 20 to line 10.

Connection capacitor 20 generates a sense current in response to noise on line 10 and injects the compensation voltage back into line 10. The sense current flows from line 10 through connection capacitor 20 into gain control circuit 121, while the compensation voltage generated by gain control circuit 121 is transferred in the opposite direction through connection capacitor 20 back to line 10.

Gain control circuit 121 acts as a current-controlled voltage source to provide a trans-impedance function. Gain control circuit 121 uses variable capacitor 40 to convert the internal current into the internal voltage, so variable capacitor 40 acts as a transfer unit for gain control circuit 121.

Current flow through connection capacitor 20 and variable capacitor 40 are in the same phase. Since current and voltage are 90-degrees out-of-phase with each other when variable capacitor 40 is used to convert current to voltage, gain control unit 121 could reverse the polarity of the voltage drop on variable capacitor 40 by 180 degrees. This reversed voltage is injected between node N1 and ground. Thus the active filter circuit acts to compensate for the instantaneous current variations or noise on line 10

Bias circuit 122 provides operating conditions by generating bias voltages or bias currents for internal nodes within gain control circuit 121. Bias circuit 122 generates bias voltages or currents from power and ground that are separate from line 10. The resistance of variable capacitor 40 can be adjusted to adjust the performance of the active filter. The impedance of variable capacitor 40 can be adjusted to adjust the performance of the active filter.

Figure 5:
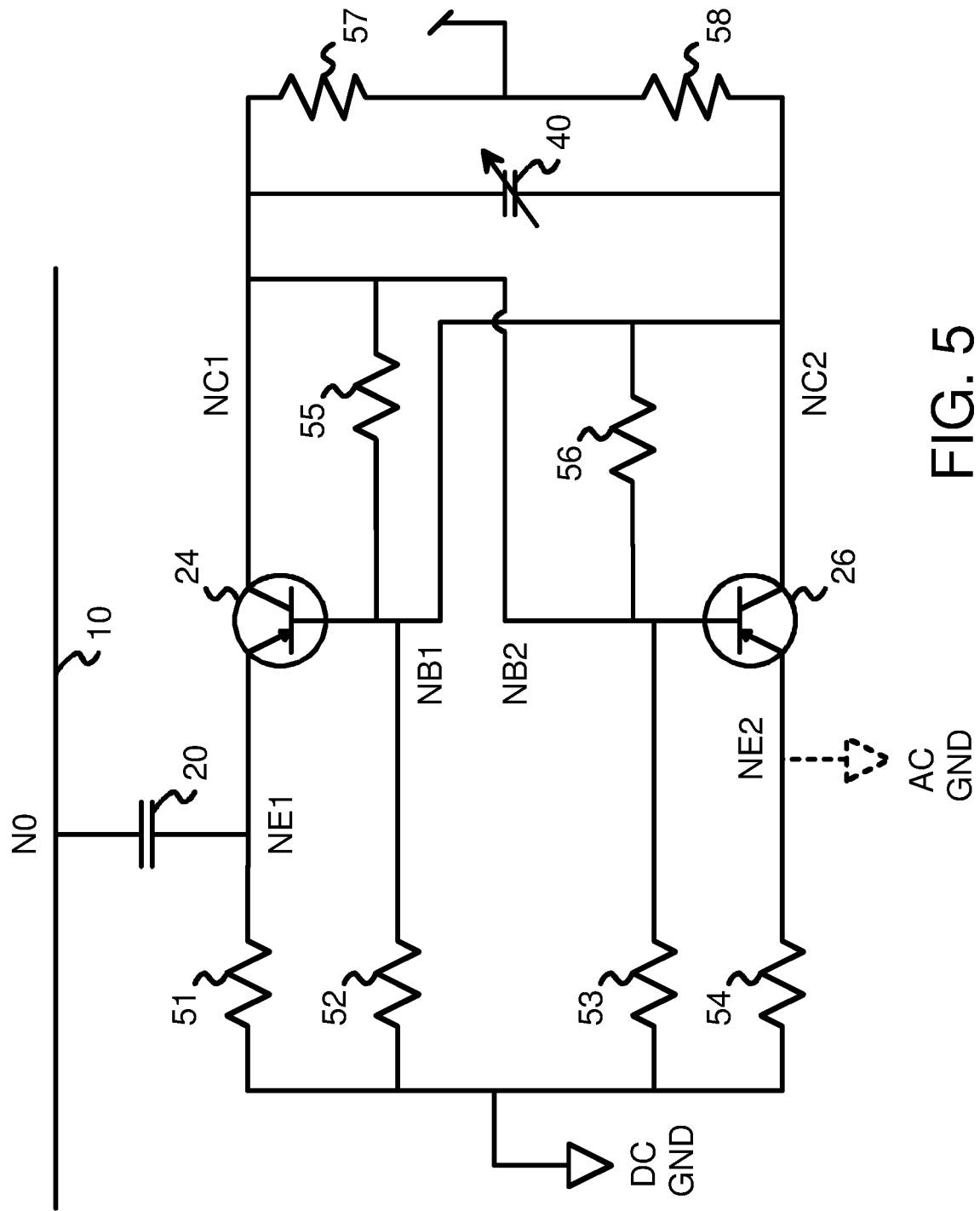
FIG. 5 is a schematic of the improved circuit for the single-point active filter with negative capacitance.

FIG. 5 is a schematic of the improved circuit for the single-point active filter with negative capacitance. Bias circuit 122 and gain control circuit 121 are shown together in FIG. 5 as a combined circuit. Bias of the emitter, node NE1, of first PNP transistor 24 is provided by resistor 51 to ground, while bias of the base, node NB1, of first PNP transistor 24 is provided by resistor 52 to ground and resistor 55 coupled between the base, node NB1, and collector, node NC1, of first PNP transistor 24. Similarly, bias the emitter, node NE2, of second PNP transistor 26 is provided by resistor 54 to ground, while bias of the base, node NB2, of second PNP transistor 26 is provided by resistor 53 to ground and resistor 56 coupled between the base, node NB2, and collector, node NC2, of second PNP transistor 26.

Resistor 57 to power provides a current to collector node NC1 of first PNP transistor 24, while resistor 58 to power provides a current to collector node NC2 of second PNP transistor 26. These bias resistors set up a negative current from ground to the emitters and bases, turning on PNP transistors 24, 26 to conduct larger collector currents. Node NE2 acts as an AC ground for small-signal analysis, while the left terminals of resistors 51, 52, 53, 54 connect to a hard DC ground such as a chassis ground or ground pin.

PNP transistors 24, 26 have their bases and collectors cross-coupled to reverse the polarity of the voltage drop on variable capacitor 40 by 180 degrees. This reversed voltage is injected between node N1 and ground, thus the active filter circuit acts to compensate for the instantaneous current variations or noise on line 10. Collector node NC1 of first PNP transistor 24 drives the base NB2 of second PNP transistor 26, while collector node NC2 of second PNP transistor 26 drives the base NB1 of first PNP transistor 24. Collector nodes NC1, NC2 are applied to two terminals of variable capacitor 40.

The sense current from line 10 can be considered to be a small-signal AC signal. For small-signal AC analysis, resistors 51-58 can be ignored. The AC sense current from line 10 flows through connection capacitor 20, PNP transistor 24 from NE1 to NC1, then through variable capacitor 40 to node NC2, then through PNP transistor 26 from NC2 to NE2, which is a virtual ground.

Connection capacitor 20 drives the sense current onto first emitter node NE1. Since the base current is small compared to the collector current, most of this sense current flows to the collector, node NC1. Likewise, the base current of PNP transistor 26 is small, so most of the collector current flows to the emitter, NE2.

The base-emitter voltage Vbe is fixed by the PN emitter junction. So VNE1=VNB1+Vbe, and since VNC2=VNB1 due to cross-coupling, VNE1=VNC2+Vbe. Similarly for PNP transistor 26, VNE2=VNC1+Vbe.

The voltage drop across variable capacitor 40 is:

$$VNC1 - VNC2 = I_{SENSE}(1/sC40),$$

where $I_{SENSE}$ is the sense current through connection capacitor 20, and sC40 is the equivalent capacitance of variable capacitor 40 in the s-domain.

The overall voltage drop across gain control circuit 121 is VNE1−VNE2. Substituting VNE1=VNB1+Vbe and VNE2=VNB2+Vbe:

$$VNE1 - VNE2 = (VNB1 + Vbe) - (VNB2 + Vbe) = VNB1 - VNB2$$

Figure 1:
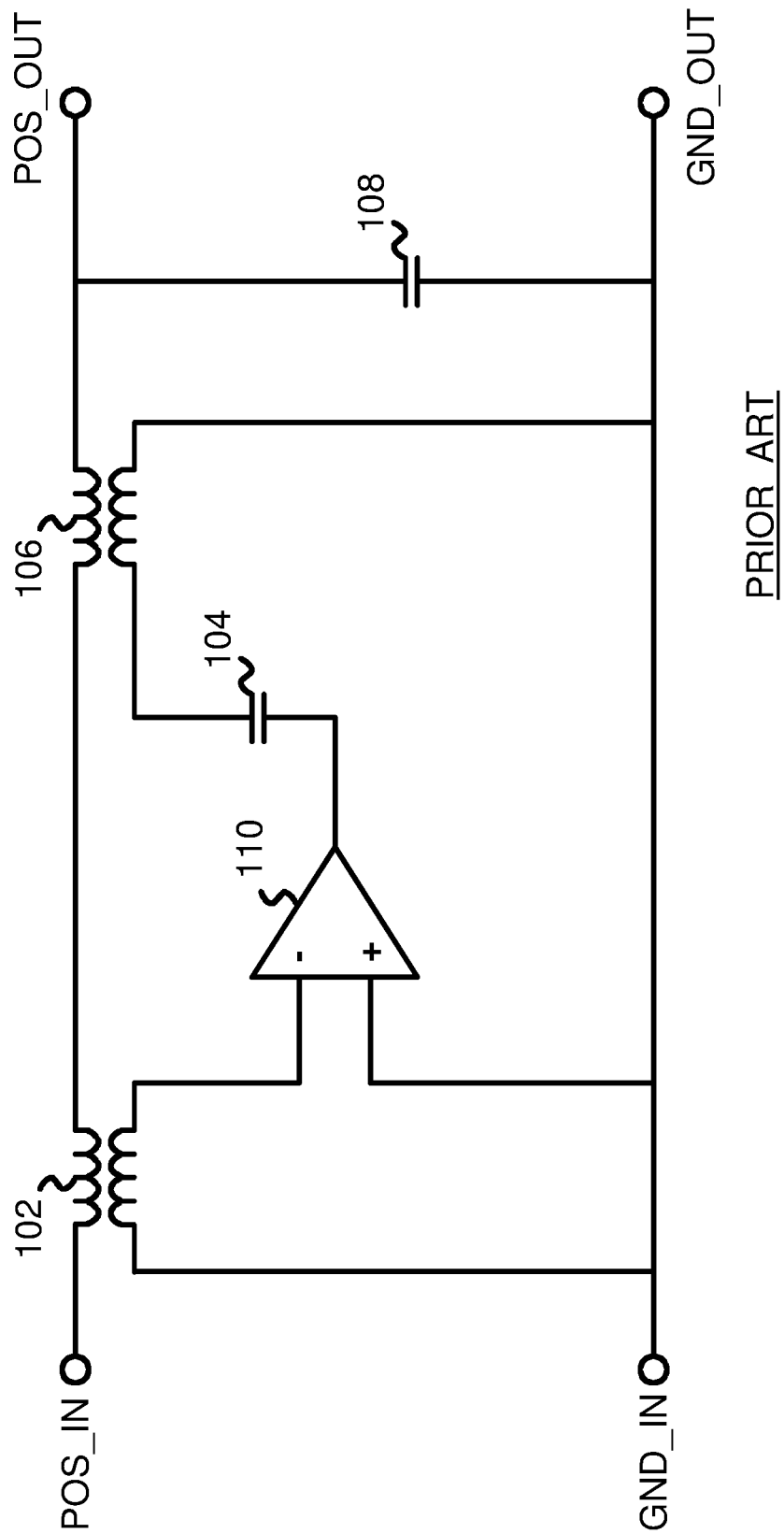
FIG. 1 shows a prior-art active EMI filter with separate sensor and injection points.
Figure 2:
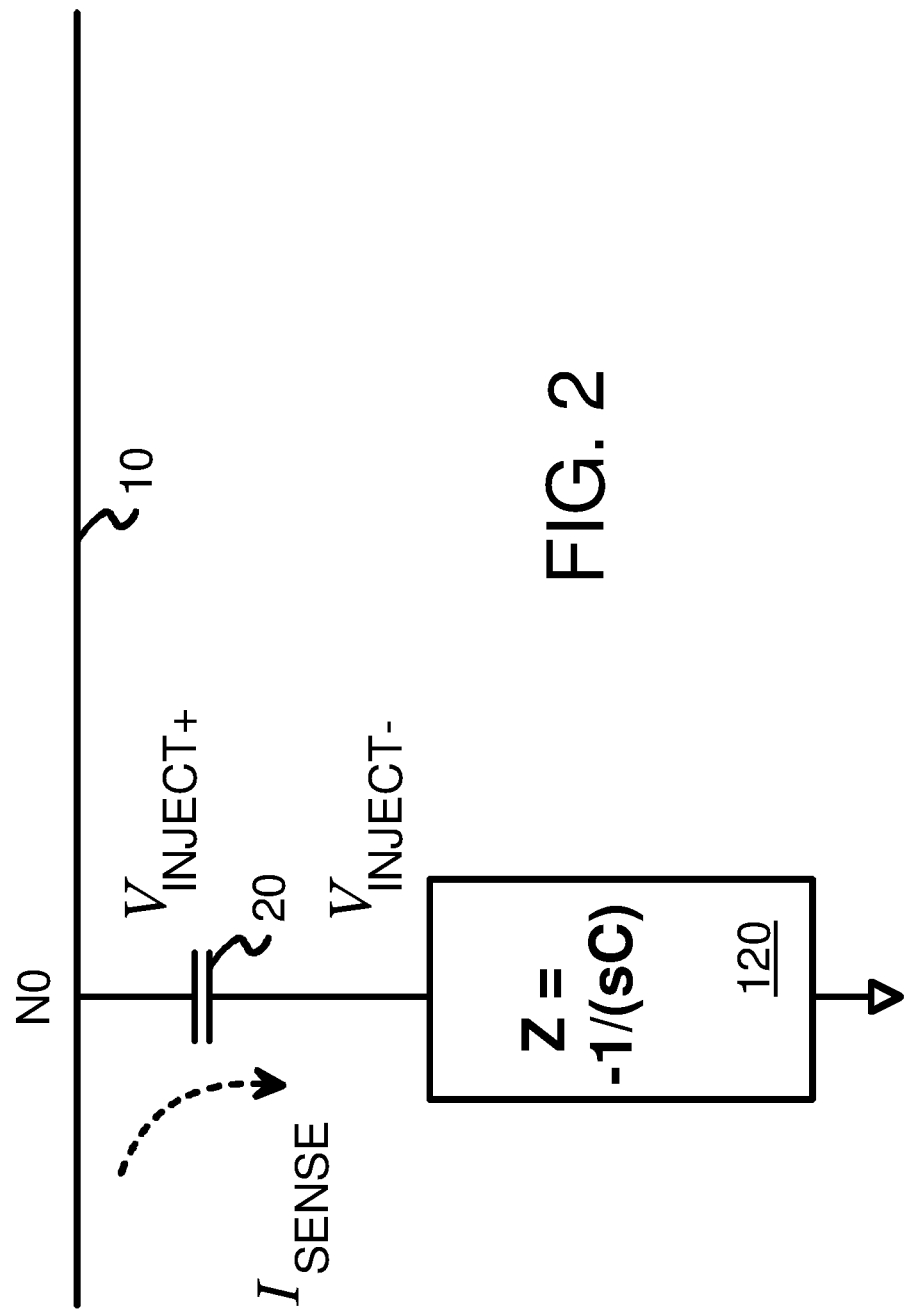
FIG. 2 highlights an active filter with a single point of attachment.

Due to cross-coupling, VNB1=VNC2, and VNB2=VNC1, so $$VNE1 - VNE2 =$$
$$VNB1 - VNB2 = VNC2 - VNC1 = -(VNC1 - VNC2) = -I_{SENSE}(1/sC40)$$

which is for a negative capacitance circuit. Thus gain control circuit 121 acts as a negative capacitance circuit (FIG. 2).

Since connection capacitor 20 and gain control circuit 121 are connected in series, the equivalent capacitance of the series connection is:

$$C20//C40 = C20*C40/(C20 + C40)$$

By adjusting the capacitance of variable capacitor 40, the active filter circuit can be adjusted.

Also, since VNE1−VNE2=$I_{SENSE}$ (1/sC40), and $I_{SENSE}$ is sensed from line 10, any change in total capacitance by adjusting variable capacitor 40 produces no additional change on line 10, node NO. Thus gain control circuit 121 acts as a current-controlled voltage source.

Variable capacitor 40 a variable capacitance, allowing adjustment or scaling of the injected voltage. The resistance values of resistors 51-58 may be selected or adjusted to set the gain and other characteristics of gain control circuit 121. Variable resistors could also be substituted. These variable resistances and capacitance can be adjusted to compensate for temperature, or for different operating conditions such as when a different frequency band or switching frequency is selected.

FIGS. 6A-6B are graphs of operation of the active filter. In FIG. 6A, the current flowing along line 10 oscillates, such as at a frequency of switching of the power transistors in a Switch-Mode Power Supply. This current is sensed through connection capacitor 20 and then through gain control circuit 121 to variable capacitor 40 and to AC ground. FIG. 6A plots the sensed current $I_{SENSE}$ that flows through connection capacitor 20 and into gain control circuit 121.

In FIG. 6B, the voltage of line 10 at node NO, which is the noise voltage level, lags by 90 degrees the line current and the sensed current $I_{SENSE}$ that flows through connection capacitor 20. The network is capacitive.

VNC1−VNC2 is the voltage across the terminals of variable capacitor 40. Variable capacitor 40 is a transfer unit that transfers or converts sensed current $I_{SENSE}$ into voltage information (VNC1−VNC2).

VNE1 is the voltage at Node NE1, between connection capacitor 20 and the emitter of first PNP transistor 24. VNE1 is 180-degress out-of-phase with line voltage VN0.

In operation, VNC1 equals VNE2−Vbe, and VNE2 is 0 (AC GND), so VNC1 is close to 0 too. When current $I_{SENSE}$ flows through variable capacitor 40, the voltage drop VNC1−VNC2 on variable capacitor 40 is positive, which means that VNC2 is lower than ground. Meanwhile, VNC2 equals VNE1−Vbe, which means VNE1 is lower than VNE2 (AC GND).

After sensing current $I_{SENSE}$, voltage VNE1 is pulled low, below the AC ground by the transistor-based cross-connected circuit and variable capacitor 40. Thus VN0 is also pulled low. Adjusting the capacitance value of variable capacitor 40 allows for adjustment to the amount of noise reduction to compensate for the current changes in line 10, and the amount of EMI reduction.

Figure 7:
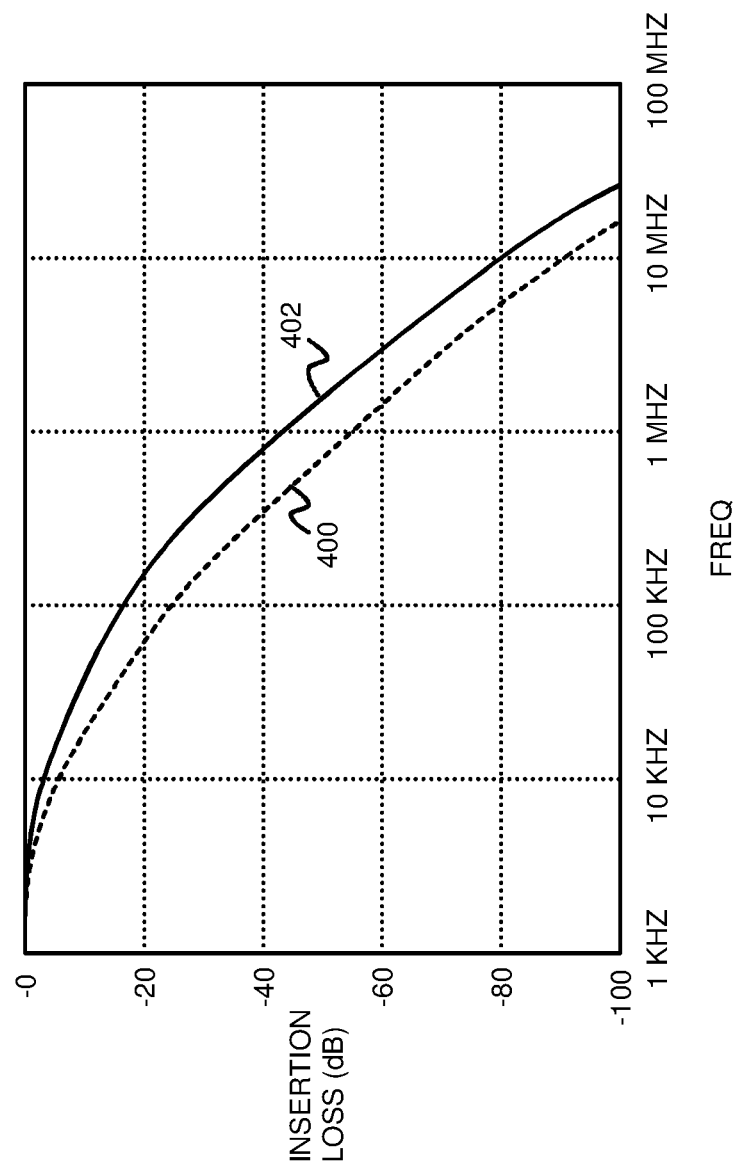
FIG. 7 is a graph showing a reduction in insertion loss using the active filter.

FIG. 7 is a graph showing a reduction in insertion loss using the active filter. Curve 402 shows the insertion loss for a passive LC filter where C has the same capacitance value as connection capacitor 20. Curve 400 shows the insertion loss for an active LC filter with the active filter such as shown in FIG. 5 and a theoretical series inductor L. The insertion loss is reduced by about 10 dB at 2 MHz using the active filter of FIG. 5 compared with a passive filter of the same capacitor size. This is only about 2 dB worse than the parent application's active filter, but for a potentially lower-cost circuit.

The active filter can also reduce EMI by as much as 75% at 2 MHz. A smaller capacitor in the active filter may be used to achieve the same EMI reduction as a passive filter. The size and bulk of the filter may be reduced.

Figure 8:
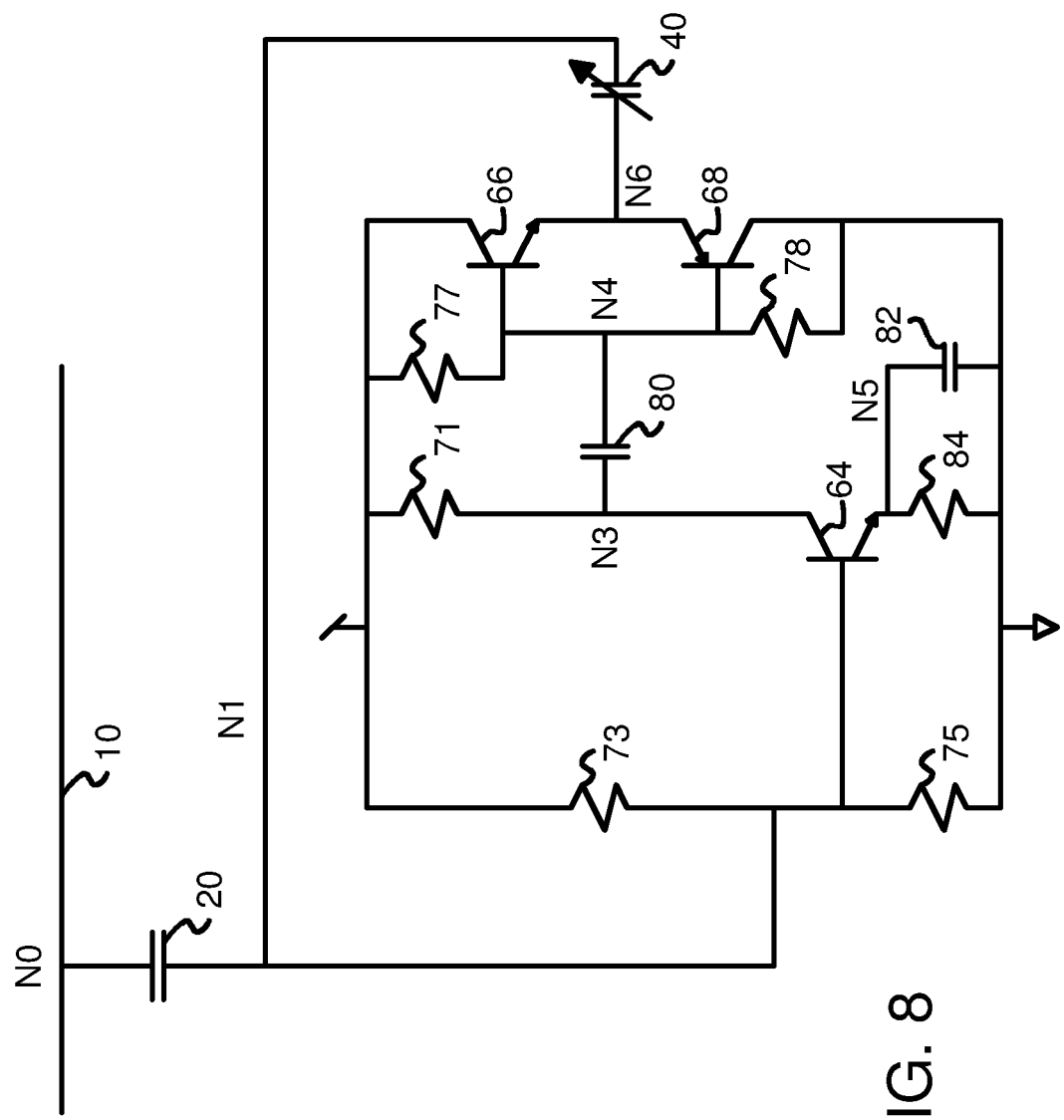
FIG. 8 is an alternative active filter with multiple levels of transistors.

FIG. 8 is an alternative active filter with multiple levels of transistors. The sense current from connection capacitor 20 is applied to the base of NPN transistor 64, and this base is also biased by resistors 73, 75. Changes in the sense current change the emitter-base current through NPN transistor 64, changing the collector current from resistor 71 to node N3 that is coupled to the bases of NPN transistor 66 and PNP transistor 68 by capacitor 80. The emitter of NPN transistor 64, node N5, connects to ground through resistor 84 in parallel with capacitor 82.

The output stage bases, node N4, is biased by resistors 77, 78. The emitters of NPN transistor 66 and PNP transistor 68 are connected together at node N6, which is the first terminal of variable capacitor 40. Current driven to variable capacitor 40 by NPN transistor 66 and PNP transistor 68 is converted to a compensation voltage by variable capacitor 40, which uses its second terminal, node N1, to directly inject this compensation voltage back through connection capacitor 20 to line 10.

The design flexibility of the circuit of FIG. 8 is higher compared to circuits using op-amps. The circuit could have a stronger current capability due to this design flexibility, and power amplifier 114 (FIG. 3) is removed. The number of components is also reduced so that the footprint might be smaller, and it could be possible to be integrated into an IC format. The cost may be reduced by roughly 70% since transistors are cheaper.

Figure 9:
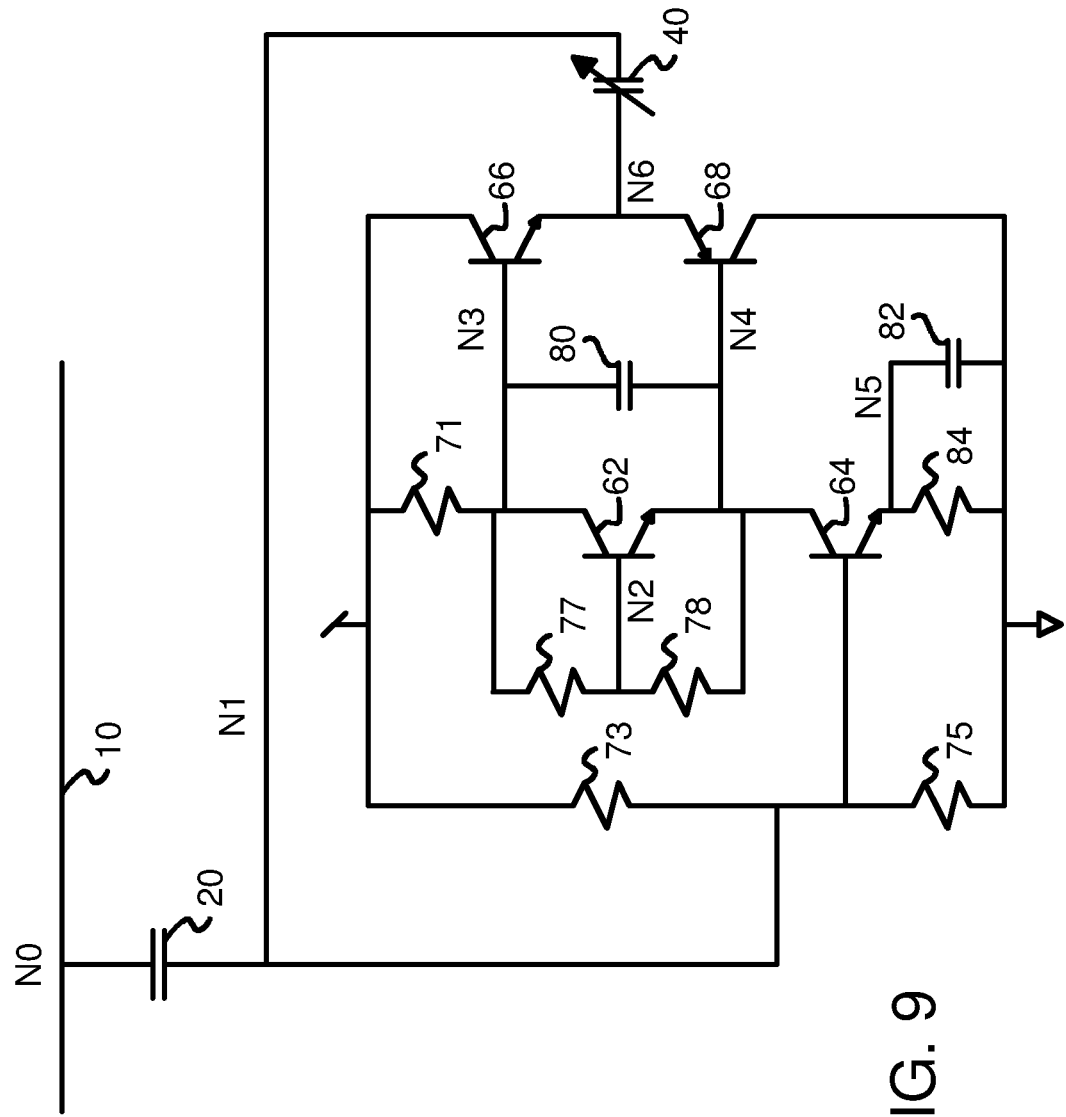
FIG. 9 is another alternative active filter with multiple levels of transistors.

FIG. 9 is another alternative active filter with multiple levels of transistors. NPN transistor 62 is added between the collector of NPN transistor 64 and resistor 71. The base of NPN transistor 62 is biased by resistors 77, 78. The base of NPN transistor 66, node N3, is driven directly by the collector of NPN transistor 62, while the base of NPN transistor 68, node N4, is driven directly by the emitter of NPN transistor 62. Capacitor 80 is connected between the bases of NPN transistor 66 and PNP transistor 68, nodes N3, N4.

Figure 10:
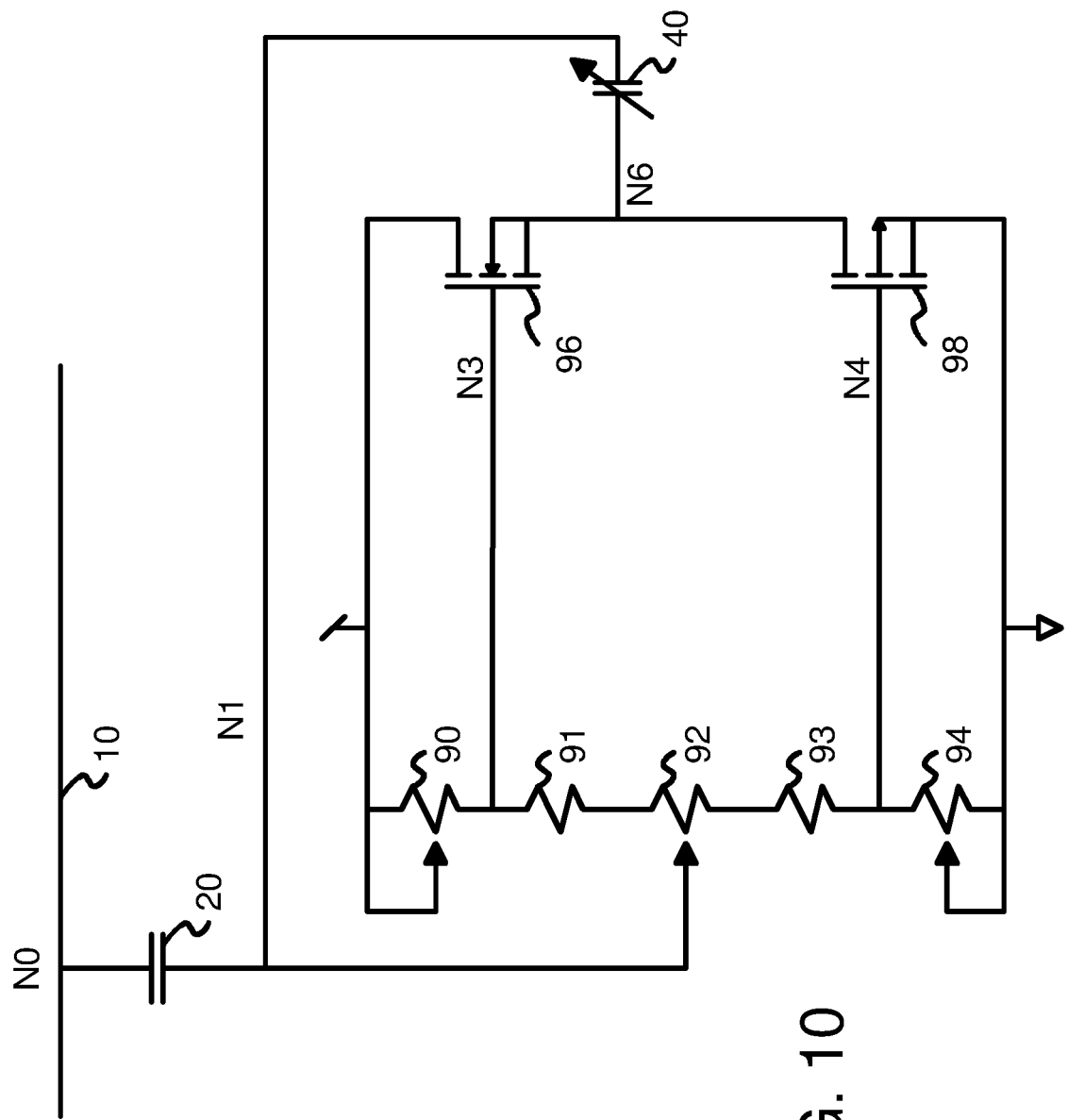
FIG. 10 is an active filter with a simplified MOS circuit.

FIG. 10 is an active filter with a simplified MOS circuit. A series of resistors 90-94 form a voltage divider between power and ground to generate a first gate voltage on node N3 and a second gate voltage on node N4. Pullup transistor 96 has a gate driven by node N3, while pull-down transistor 98 has a gate driven by node N4. The drains of transistors 96, 98 are connected together at node N6 to drive one terminal of variable capacitor 40, while the other terminal of variable capacitor 40 is node N1, allowing variable capacitor 40 to directly inject the compensation voltage back to node N1 and connection capacitor 20.

The sense current from connection capacitor 20 is applied to select the resistance of middle resistor 92, which can be a variable resistor along with resistors 90, 94. Pull-up transistor 96 can be a p-channel transistor while pull-down transistor 98 can be an n-channel transistor, using standard Complementary Metal-Oxide-Semiconductor (CMOS), Gallium-Nitride (GaN), or other transistor devices.

Figure 11:
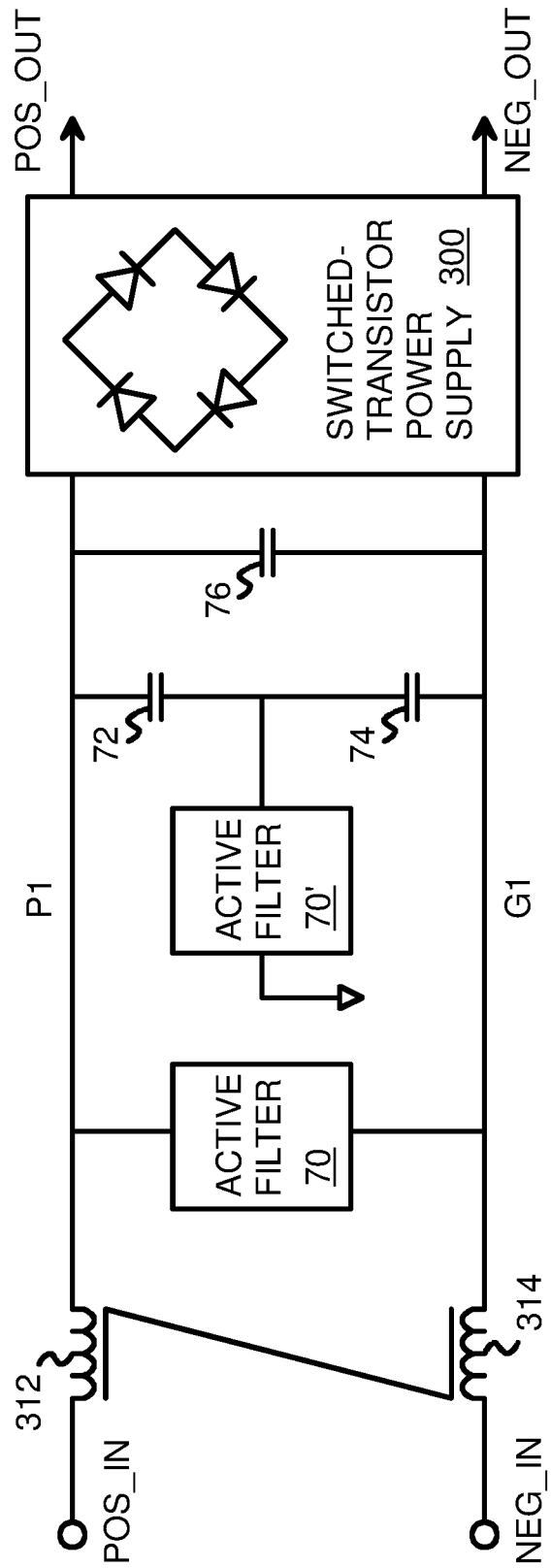
FIG. 11 shows active filters being used as differential and common-mode filters.

FIG. 11 shows active filters being used as differential and common-mode filters. Switched-Transistor Power Supply (STPS) 300 generates undesirable EMI. To reduce this EMI, active filter 70 is coupled between positive line P1 and negative line G1. Active filter 70 can be the active filter of FIG. 5 with line 10 being line P1 and ground being negative line G1.

Active filter 70' is connected to a common-mode node CM between capacitor 72 to P1, and capacitor 74 to G1. Active filter 70' can be the active filter of FIG. 5 with line 10 being the common mode node CM between capacitors 72, 74, and ground being negative line G1 or another ground node.

Inductor 312 filters POS_IN to generate node P1, while inductor 314 filters NEG_IN to generate G1. Capacitor 76 between P1 and G1 filters ripple in the power supply.

Figure 12:
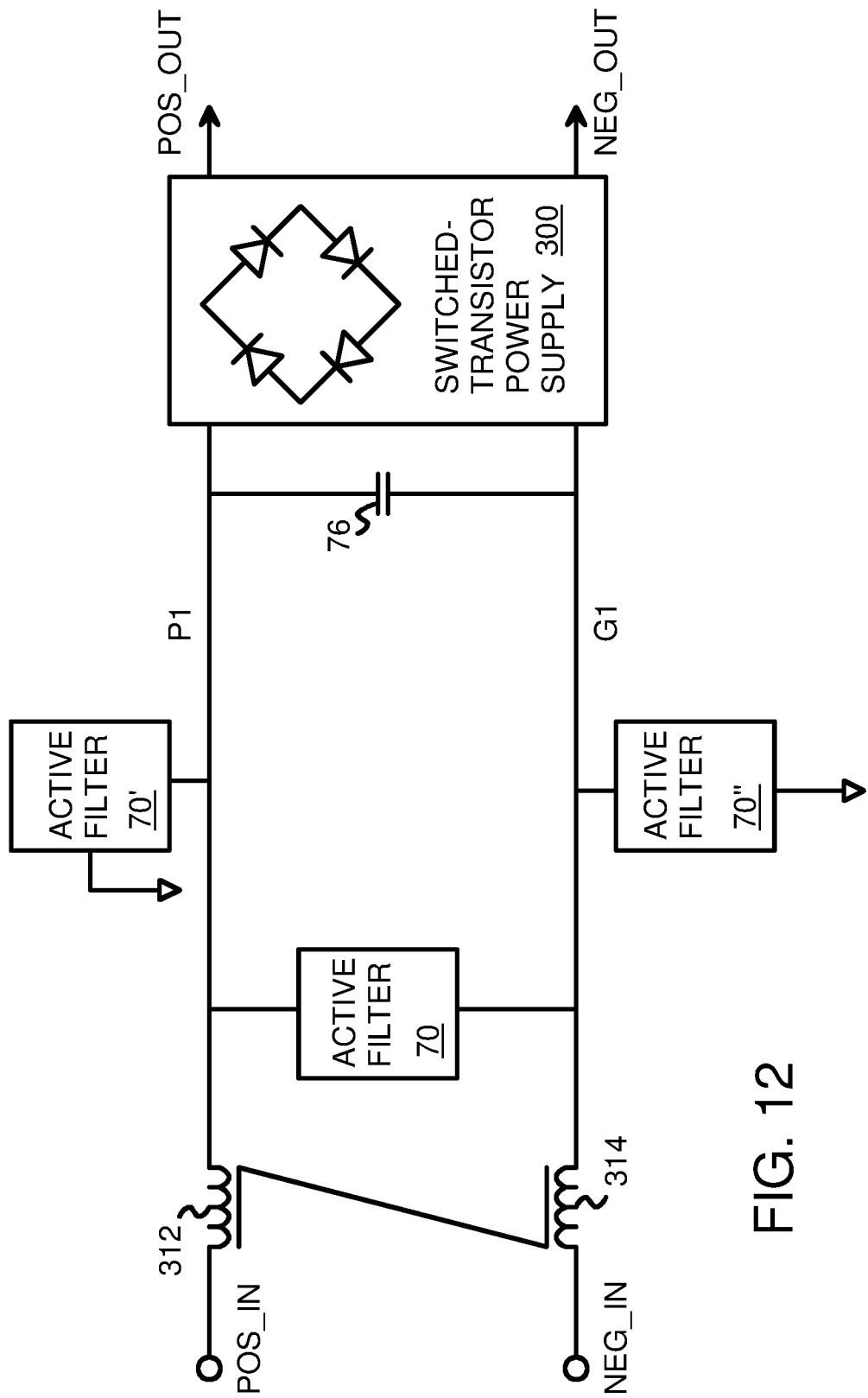
FIG. 12 shows active filters being used as differential and single-line filters.

FIG. 12 shows active filters being used as differential and single-line filters. Switched-Transistor Power Supply (STPS) 300 generates undesirable EMI. To reduce this EMI, active filter 70 is coupled between positive line P1 and negative line G1. Active filter 70 can be the active filter of FIG. 5 with line 10 being line P1 and ground being negative line G1.

Active filter 70' is connected to power line P1. Active filter 70' can be the active filter of FIG. 5 with line 10 being power line P1, and ground being an independent ground node such as earth in an AC system or COM in DC-DC systems.

Active filter 70" is connected to negative power line G1. Active filter 70" can be the active filter of FIG. 4 with line 10 being negative power line G1, and ground being an independent ground node.

ALTERNATE EMBODIMENTS

Several other embodiments are contemplated by the inventors. For example various circuits and configurations may be used. Transistors may be cross-coupled in some circuits, but not in other circuits. Feedback may be modified. Variable capacitor 40 may have both terminals connected to the output of gain control circuit 121 (FIG. 5), or may have only one terminal connected to the output of gain control circuit 121 (FIGS. 8-10), with the other terminal of variable capacitor 40 connected directly to node N1 and coupling capacitor 20, so that variable capacitor 40 provides the injected voltage directly to coupling capacitor 20 rather than back through gain control circuit 121.

A single capacitor may be implemented as several parallel capacitors, and a variable capacitor may be implemented by a switched-capacitor array such as a binary-weighted capacitor array and a decoder. Gain control circuit 121 may be replaced with other active circuits that have an input impedance in the format of Z=−V/I, such as a power transistor circuit.

Variable capacitor 40 could be an electronically controlled capacitance, such as voltage tuned capacitance or digitally tuned capacitance (but not limited to this). An active filter with variable components is desired for gain compensation in different temperature conditions and frequency bands, in case the equivalent impedance of variable capacitor 40 varies for different temperature or frequencies.

While reducing EMI on a power line has been described, EMI may also be reduced in downstream circuits that are powered by the power line. The active filter may be applied to a variety of applications for a variety of purposes other than EMI reduction. The active filter may be applied to internal nodes on an Integrated Circuit (IC) to reduce internal cross-talk interference. The active filter may be attached to an internal clock line to reduce EMI generated by that clock line. The active filter could be connected across differential data lines in a telecom system to filter noise on these lines. Application scenarios that need filters to reduce small signals can benefit from the invention.

A controller or initializer or calibrator could be added to select the value of variable capacitor 40 or the values of any of resistors 51-58 if variable resistors are used. A temperature compensator could compensate the bandwidth of the gain-control unit using analog components such as a resistor and a Negative Temperature Coefficient (NTC) device such as a thermistor. The controller could be digital and receive a temperature measurement and look up values in a table to apply to the variable capacitor or variable resistors. The controller could likewise receive a mode bit that indicates a frequency of operation and adjust the variable capacitance or variable resistances according to settings from a look up table. Some of the variable components could be fixed while others are varied. Connection capacitor 20 could be a variable capacitor rather than a fixed capacitor.

Negative capacitance circuit 120 could be a negative impedance converter, a negative load, or another circuit that injects energy back into a system rather than stores energy from that system. While a phase shift of 90 degrees between the input sensed current and the output injected voltage has been shown in FIGS. 6A-6B, a different phase shift such as 180 degrees may be substituted, and the actual phase shift may depend on circuit delays. Variable capacitor 20 could be substituted with a transfer impedance that could be an inductor rather than a capacitor. Likewise, connection capacitor 20 could be replaced by an inductor. A more complex network of capacitors, inductors, and/or resistors could be substituted as well.

Values could be scaled or otherwise operated upon. Parameters such as delays and targets could be adjusted or scaled based on conditions such as device temperature or length of time between detected faults, or statistics or properties of the particular load being driven. For example, large loads with large capacitances could have a longer setting for the TRIP delay and a larger value of the threshold TH than do loads with smaller capacitances or with less switching of load capacitances. When the load uses a higher-frequency clock, TRIP and TH could be increased to allow for more capacitor charging.

Currents may be positive currents or negative currents and may flow in either direction, depending on the carrier polarity. Various theories of operation have been presented to help understand the operation of the system as best understood, but these theories are only approximations of actual circuit behavior and may be incorrect.

Additional components may be added at various nodes, such as resistors, capacitors, inductors, transistors, buffers, dividers, etc., and parasitic components may also be present. Enabling and disabling the circuit could be accomplished with additional transistors or in other ways. Pass-gate transistors or transmission gates could be added for isolation. Inversions may be added, or extra buffering. Separate power supplies and grounds may be used for some components. Various filters could be added. Active low rather than active high signals may be substituted. Various reference voltages or virtual supplies may be used rather than a hard ground.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An active filter comprising:
   a connection capacitor connected between a current-carrying line and a first node;
   a gain control unit a first input receiving the first node, the gain control unit generating a first output in response to the first node;
   a bias circuit for biasing the gain control unit;
   a transfer capacitor connected to the first output;
   wherein changes in a line current on the current-carrying line induce a sense current through the connection capacitor that is applied to the gain control unit to generate the first output, wherein the transfer capacitor converts the first output to an injected voltage that is injected back through the connection capacitor from the first node to the current-carrying line to compensate for changes in a line voltage on the current-carrying line;
   wherein the connection capacitor carries the sense current from the current-carrying line to the first node, and the connection capacitor also carries the injected voltage from the first node back to the current-carrying line,
   whereby the connection capacitor carries bi-directional signals to and from the current-carrying line.

2. The active filter of claim 1 wherein the active filter is connected to the current-carrying line only through the connection capacitor;
   wherein the current-carrying line is isolated from the active filter except for a single connection point through the connection capacitor.

3. The active filter of claim 2 wherein the gain control unit further comprises:
   a first transistor having a first input connected to the first node, a first output terminal connected to the first output, and a first control node that controls a first current from the first output;

a second transistor having a second input connected to a fixed node, a second output, and a second control node that controls a second current from the second output;

wherein the first transistor and the second transistor are cross-coupled, wherein the first control node is connected to the second output, and the second control node is connected to the first output;

wherein the transfer capacitor is connected between the first output and the second output, the transfer capacitor receiving the first current from the first transistor on the first output at a first terminal of the transfer capacitor, the transfer capacitor receiving the second current from the second transistor on the second output at a second terminal of the transfer capacitor;

wherein the transfer capacitor generates a transfer voltage in response to the first current and the second current, wherein the transfer voltage is fed back through the first transistor to the first node to generate the injected voltage through the connection capacitor.

4. The active filter of claim 3 wherein the first transistor is a first bipolar transistor and the first control node is a base terminal of the first bipolar transistor;

wherein the second transistor is a second bipolar transistor and the second control node is a base terminal of the second bipolar transistor;

wherein the gain control unit has cross-coupled bipolar transistors that drive the transfer capacitor.

5. The active filter of claim 3 wherein the transfer capacitor further comprises a variable capacitor.

6. A single-connection-point active filter comprising:
a bi-directional connection point to a noisy line having a noisy current;
a connection capacitor connected from the bi-directional connection point to a first node;
a trans-impedance circuit having the first node as an input, the trans-impedance circuit generating a first current in response to the first node;
a transfer impedance connected to the first output node, the transfer impedance converting the first current generated by the trans-impedance circuit to an output voltage of the first output node;
wherein a voltage of the first node causes the transfer impedance to inject a compensation voltage back through the connection capacitor and into the noisy line at the bi-directional connection point;
wherein the compensation voltage compensates the noisy line for changes in the noisy current.

7. The single-connection-point active filter of claim 6 wherein the trans-impedance circuit further comprises:
a first bipolar transistor having a first base connected to a second output node, the first base for controlling the first current between the first output node and the first node; and
a second bipolar transistor having a second base connected to the first output node, the second base for controlling a second current between the second output node and a fixed node.

8. The single-connection-point active filter of claim 7 wherein the trans-impedance circuit further comprises:
a first bias resistor connected between the first node and a first fixed voltage supply;
a second bias resistor connected between the first base and the first fixed voltage supply;
a third bias resistor connected between the second base and the first fixed voltage supply;

a fourth bias resistor connected between the fixed node and the first fixed voltage supply;
a fifth bias resistor connected between the first base and the first output node;
a sixth bias resistor connected between the second base and the second output node;
a seventh bias resistor connected between a second fixed voltage supply and the first output node; and
an eighth bias resistor connected between the second fixed voltage supply and the second output node.

9. The single-connection-point active filter of claim 7 wherein the transfer impedance comprises a variable capacitor.

10. An active noise filter comprising:
a connection capacitor coupled between a connection point on a current-carrying line and a first node, wherein changes in current carried by the current-carrying line generates a sense current through the connection capacitor to the first node;
a gain control unit, connected to the first node to receive the sense current from the connection capacitor, for generating a transfer current in response to the sense current;
a transfer impedance that receives the transfer current generated by the gain control unit, the transfer impedance converting the transfer current into a transfer voltage;
wherein the transfer voltage on the transfer impedance induces an injected voltage across the connection capacitor to compensate the current-carrying line,
whereby Electro-Magnetic Interference (EMI) generated by the current-carrying line is reduced by the active noise filter.

11. The active noise filter of claim 10 wherein the gain control unit further comprises:
a first transistor having an emitter receiving the sense current from the first node, the first transistor generating a first collector current at a first collector in response to a first base;
a second transistor having an emitter, the second transistor generating a second collector current at a second collector in response to a second base;
wherein the first transistor and the second transistor are cross-coupled, wherein the first collector is connected to the second base, and the second collector is connected to the first base;
wherein the transfer impedance comprises a transfer capacitor coupled between the first collector and the second collector.

12. The active noise filter of claim 10 wherein the transfer impedance comprises a capacitor coupled between a transfer output node of the gain control unit and the first node.

13. The active noise filter of claim 12 wherein the gain control unit further comprises:
a voltage divider network of resistors that receives the sense current from the first node as an input, the voltage divider network generating a first gate voltage and a second gate voltage that vary with the sense current;
a first transistor having a first gate receiving the first gate voltage, the first gate controlling a first current to the transfer output node; and
a second transistor having a second gate receiving the second gate voltage, the second gate controlling a second current to the transfer output node.

14. The active noise filter of claim 13 wherein the first transistor comprises a Metal-Oxide-Semiconductor Field-Effect Transistor (MOSFET);

wherein the second transistor comprises a MOSFET.

15. The active noise filter of claim 14 wherein the first transistor comprises a p-channel MOSFET having a source connected to a power supply;
  wherein the second transistor comprises an n-channel MOSFET having a source connected to a ground supply;
  wherein a drain of the first transistor is connected to the transfer output node;
  wherein a drain of the second transistor is connected to the transfer output node.

16. The active noise filter of claim 12 wherein the gain control unit further comprises:
  a first input resistor coupled between the first node and a power supply;
  a second input resistor coupled between the first node and a ground;
  a first transistor having a control terminal connected to the first node, the control terminal for controlling a first current from an output terminal of the first transistor;
  a first output transistor having a control terminal responsive to the first current generated by the first transistor, the control terminal for controlling a first output current from an output terminal of the first output transistor to the transfer output node;
  a second output transistor having a control terminal responsive to the first current generated by the first transistor, the control terminal for controlling a second output current from an output terminal of the second output transistor to the transfer output node.

17. The active noise filter of claim 16 wherein the first transistor is a bipolar transistor with a base as the control terminal and a collector as the output terminal, the first transistor also having an emitter that is biased by a first bias resistor;
  wherein the first output transistor is a NPN bipolar transistor with a base as the control terminal and an emitter connected to the transfer output node, the first output transistor also having a collector;
  wherein the second output transistor is a PNP bipolar transistor with a base as the control terminal and an emitter connected to the transfer output node, the first output transistor also having a collector;
  further comprising:
  an intrastage capacitor connected between the collector of the first transistor and the base of the first output transistor.

18. The active noise filter of claim 17 wherein the base of the first output transistor and the base of the second output transistor are connected together.

19. The active noise filter of claim 17 wherein the base of the second output transistor is connected to the collector of the first transistor.

20. The active noise filter of claim 17 wherein the transfer impedance comprises a variable capacitor.

* * * * *